United States Patent
Wolf et al.

(10) Patent No.: US 10,261,425 B2
(45) Date of Patent: Apr. 16, 2019

(54) PROJECTION EXPOSURE APPARATUS WITH A HIGHLY FLEXIBLE MANIPULATOR

(71) Applicant: Carl Zeiss SMT GmbH, Oberkochen (DE)

(72) Inventors: Alexander Wolf, Oberkochen (DE); Toralf Gruner, Aalen-Hofen (DE); Boris Bittner, Roth (DE); Norbert Wabra, Werneck (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 73 days.

(21) Appl. No.: 14/837,142

(22) Filed: Aug. 27, 2015

(65) Prior Publication Data

US 2016/0054662 A1 Feb. 25, 2016

Related U.S. Application Data

(63) Continuation of application No. PCT/EP2014/054662, filed on Mar. 11, 2014.
(Continued)

(30) Foreign Application Priority Data

Mar. 15, 2013 (DE) ........................ 10 2013 204 572

(51) Int. Cl.
*G03B 27/42* (2006.01)
*G03F 7/20* (2006.01)

(52) U.S. Cl.
CPC .......... *G03F 7/706* (2013.01); *G03F 7/70266* (2013.01); *G03F 7/70308* (2013.01); *G03F 7/70891* (2013.01)

(58) Field of Classification Search
CPC .. G03F 7/70891; G03F 7/70308; G03F 7/706; G03F 7/70266; G03F 7/70191;
(Continued)

(56) References Cited

U.S. PATENT DOCUMENTS

| 8,659,745 B2 | 2/2014 | Limbach et al. |
| 2008/0024874 A1 | 1/2008 | Uitterdijk et al. |

(Continued)

FOREIGN PATENT DOCUMENTS

| DE | 10 2007 062 265 A1 | 7/2008 |
| DE | 10 2008 043 243 A1 | 10/2009 |

(Continued)

OTHER PUBLICATIONS

International Search Report and Written Opinion for corresponding PCT Appl No. PCT/EP2013/069575, dated Jul. 29, 2014.
(Continued)

*Primary Examiner* — Mesfin T Asfaw
(74) *Attorney, Agent, or Firm* — Fish & Richardson P.C.

(57) ABSTRACT

The invention relates to a projection exposure apparatus for semiconductor lithography, comprising at least one manipulator for reducing image aberrations, wherein the manipulator has at least two optical elements that can be positioned relative to one another, wherein at least one of the optical elements is spatially dependent in terms of its effect on an optical wavefront passing therethrough such that a local phase change of a wavefront propagating in the optical system is produced in the case of a relative movement of the optical elements against one another. Here, the spatially dependent effect of the at least one optical element can be set in a reversible dynamic manner.

21 Claims, 4 Drawing Sheets

Related U.S. Application Data

(60) Provisional application No. 61/790,629, filed on Mar. 15, 2013.

(58) Field of Classification Search
CPC ............. G03F 7/70258; G03F 7/7015; G03F 7/70875; G03F 7/70883; G03F 7/70558
See application file for complete search history.

(56) References Cited

U.S. PATENT DOCUMENTS

| | | | |
|---|---|---|---|
| 2008/0239503 A1 | 10/2008 | Conradi et al. | |
| 2009/0213352 A1 | 8/2009 | Goehnermeier | |
| 2009/0244509 A1* | 10/2009 | Limbach | G02B 27/0068 355/67 |
| 2010/0201958 A1 | 8/2010 | Hauf et al. | |

FOREIGN PATENT DOCUMENTS

| | | |
|---|---|---|
| EP | 1 881 373 A1 | 1/2008 |
| JP | H10-242048 A | 9/1998 |
| JP | 2008-028388 A | 2/2008 |
| JP | 2009-503826 A | 1/2009 |
| JP | 2010-511298 A | 4/2010 |
| JP | 2010-166007 A | 7/2010 |
| JP | 2011-520240 A | 7/2011 |
| TW | 201329645 A1 | 7/2013 |
| WO | WO 2007/017089 | 2/2007 |
| WO | WO 2008/064859 A1 | 6/2008 |
| WO | WO 2009/26970 A1 | 3/2009 |
| WO | WO 2013/044936 A1 | 4/2013 |

OTHER PUBLICATIONS

Office Action for corresponding German Application No. 10 2013 204 572.7 dated Jan. 28, 2014 in English.
Japanese Office Action, with translation thereof, for JP Appl No. 2015-562084, dated Sep. 5, 2016.
Korean Office Action, with translation thereof, for KR Appl No. 2015-7024864, dated Jun. 28, 2016.
Taiwanese Office Action and Search Report, with translation thereof, for corresponding Appl No. 103108991, dated Jun. 19, 2017, 9 pages.

* cited by examiner

PROJECTION EXPOSURE APPARATUS WITH A HIGHLY FLEXIBLE MANIPULATOR

CROSS-REFERENCE TO RELATED APPLICATIONS

The present application is a continuation of, and claims benefit under 35 USC 120 to, international application PCT/EP2014/054662, filed Mar. 11, 2014, which claims benefit under 35 USC 119 of German Application No. 10 2013 204 572.7, filed Mar. 15, 2013. International application PCT/EP2014/054662 also claims priority under 35 USC 119(e) to U.S. Provisional Application No. 61/790,629, filed Mar. 15, 2013. The entire contents of International application PCT/EP2014/054662 are incorporated by reference herein.

The invention relates to a projection exposure apparatus for semiconductor lithography, and a method for operating such an apparatus.

Modern lithography processes operate using resolution-increasing measures such as double and multiple structuring and the so-called "Spacering". In the process, fine structures are produced in successive exposure steps. These methods only work if the exposed structures from the successive steps are aligned in a highly precise manner in relation to one another, for example offset by half a period.

For projection exposure apparatuses and, in particular, the projection lens, the requirements for accuracy, in particular in respect of the lateral structure positioning, increase more than proportionally in relation to single structuring, i.e. it increases not only linearly with the resolution.

At the same time, high apertures, which can lie at values of 0.4 and higher are often used in the resist. In so doing, the quotient of numerical aperture and resist refractive index is considered. In the so-called VUV range with 193 nm exposure wavelength, the resist refractive index lies at approximately 1.7; in the so-called EUV range at 13.5 nm wavelength or less (e.g. 7 nm), it lies at 1.0. At high beam angles in the resist, the light polarization becomes noticeable as a so-called vector effect: the field components of interfering orders are only in parallel and only supply good contrast in the case of tangential polarization. In the case of radial polarization, there is a significant relative angle, which has a contrast-reducing effect and may even lead to contrast reversal.

The region with a high depth of field scales with the operating wavelength and the reciprocal square of the aperture. The depth of field reduces to less than 70 nm in the case of an EUV wavelength with numerical apertures above 0.4 or in the case of a VUV wavelength and apertures above 1.1. The focus plane of the lithographic image must be positioned in a correspondingly accurate manner in relation to the physical surface of the photoresist.

A further motivation for an exact alignment of the image plane in relation to the resist lies in the telecentricity effect. Telecentricity in the system brings about an oblique extent of the image relative to the light direction. Changing the exposure point in the light direction translates into a lateral image position variation, which has a negative effect on the lateral image position accuracy as required above.

Overall, there are greater demands on matching the focus position to the real surface of the exposed semiconductor substrate. This usually relates to a photoresist, which is applied by spin coating, having unevenness as a result of the application process. This results in the demand for adjusting the focus after a preceding measurement of the substrate topology during the scanning procedure, i.e. down to the tenths of a second range. To this end, fast manipulators are required. Moreover, it should be possible to vary not only the focus but also the scale and the distortion on this timescale, in particular in order to be able to compensate reticle heating.

At this point, the so-called Alvarez manipulator is mentioned as an example for a fast manipulator; it has substantially two mutually displaceable aspherically configured optical elements, through both of which the wavefront of the optical radiation to be manipulated passes in succession. As a result of the fact that the optical effects of the involved optical elements add, the upshot of a relative movement of the optical elements lies in a modified spatially resolved influence on the wavefront being achieved. By way of example, such a manipulator is described in the international patent application WO 2008/064859 A1. However, the options for influencing the wavefront are restricted by the geometry of the employed optical elements of the manipulator.

It is therefore an object of the present invention to specify a projection exposure apparatus for semiconductor lithography, and a method, by which an improved and, in particular, faster and more flexible correction of the focus or of image aberrations becomes possible.

This object is achieved by the device and the method with the features listed in the independent claims. The dependent claims relate to advantageous embodiments and developments of the invention.

The projection exposure apparatus for semiconductor lithography, according to the invention has at least one manipulator for reducing image aberrations, wherein the manipulator has at least two optical elements that can be positioned relative to one another. Here, at least one of the optical elements is spatially dependent in terms of its effect on an optical wavefront passing therethrough such that a local phase change of a wavefront propagating in the optical system is produced in the case of a relative movement of the optical elements against one another. The spatially dependent effect of the at least one optical element can be set in a reversible, i.e. time variable, dynamic manner. In this context, reversible means that 50%, preferably 80%, more preferably 99%, of this spatially dependent effect (measured using a suitable metric, e.g. the change of an averaged wavefront "RMS" deviation or "peak to valley".) can be undone without removing the optical components from the lithographic projection exposure apparatus or without integrating additional components therein solely by manipulating the same components.

Here, this spatially dependent effect can be achieved, in particular, by virtue of the fact that at least one of the optical elements has at least one surface that can be embodied in an aspherical manner, the geometry of which surface can be set.

In other words, according to the invention, the spectrum of use of a conventional Alvarez manipulator is extended by virtue of at least one of the surfaces involved in the manipulator effect, or at least one of the optical elements, being able to be adapted. In addition to being able to set the manipulator effect quickly as a result of the mechanical displacement of the two optical elements against one another, which can be performed quickly, there also is the large amount of flexibility emerging from being able to select the spatially dependent optical effect, for example by adapting the surface geometry, of at least one of the optical elements involved. Overall, what is obtained is a manipulator that is fast and, in view of the pre-selectable correction properties, highly flexible.

Here, at least one of the optical elements is both able to have an effect on the wavefront propagating in the optical system in reversible dynamic settable spatially dependent manner and designed to be movable relative to a default state position.

Here, the local phase effect of the one optical element can be modified within time periods of less than an hour, in particular of less than 10 minutes, more preferably of less than 20 seconds, such that a desired property of the manipulator in the case of an offset of the two optical elements in relation to one another can be set during this time period with a high measure of flexibility.

In so doing, it is advantageous if an accuracy of 10%, preferably 5%, more preferably 2%, can be achieved when positioning the optical elements in relation to one another in order to set a desired phase effect of the whole manipulator. An offset of the optical elements in relation to one another by e.g. at least 10 micrometers or a rotation by at least 20 seconds of arc can be achieved within a time period of less than one second.

The relative movement of the optical elements can be achieved, in particular, by using pressure bellows, Lorentz manipulators and/or piezoelectric elements.

Moreover, the manipulator according to the invention can remain in the used beam path while setting the desired properties; that is to say, the complicated interchange of correction aspheres in the field is dispensed with.

In particular, the spatially dependent effect of the at least one optical element can be set via a temperature profile that can be selected in a locally resolved manner.

Here, the temperature profile that can be selected in a locally resolved manner can cause, firstly, a surface deformation and hence a desired asphericization of the surface of the relevant optical element. Additionally, or as an alternative thereto, the temperature profile can also lead to a local variation in the refractive index, as a result of which there can be a further influence on the desired effect.

Additionally, or as an alternative thereto, at least one of the involved optical elements likewise can be deformed mechanically in order to bring about a desired geometry and hence a desired phase influence on a passing electromagnetic wave. To this end, use can be made, in particular, of piezoelectric actuators.

In an advantageous embodiment of the invention, there can be resistance heating for setting the temperature profile.

An example for such resistance heating is disclosed in the international patent application WO2009/026970A1, the content of which is incorporated in its entirety in the content of the disclosure of the present description.

There, a desired temperature distribution is set over the surface of an optical element by virtue of individually actuatable heating zones with resistance wires being arranged on the surface of the optical element. The thickness and the spacing of the resistance wires in this case are selected in such a way that the wires do not substantially impair the overall functionality of the superordinate optical system, a projection exposure apparatus for semiconductor lithography in the mentioned case. Here, the resistance heating constitutes a simple variant, which can be controlled/regulated well, for spatially resolved heating of the surface.

Depending on the heating and cooling power, and the size of the optical elements, the solutions described here enable temperature profiles to be set within a time period of less than one hour, down to a time period of less than 20 seconds.

Further options for producing a temperature distribution consist of locally blowing warm or cold fluid on the object in question, of heating from the edge, in particular tomographic heating from the edge of the optical element via radiation, which is absorbed in the volume, and of oblique or perpendicular radiating of radiation on the object in question, which radiation is absorbed in a surface layer and/or in the volume.

Furthermore, there can be a device for producing a fluid flow, which flows past at least one of the optical elements, for setting the temperature profile.

As a result of the constant dissipation of the heat introduced by the resistance heating provided by the fluid flow, the latter improves the ability of controlling/regulating the arrangement according to the invention.

There can be at least one Lorentz actuator, one pressure bellows and/or one piezoelectric element for the relative movement of the surfaces of the optical elements against one another.

In particular, the geometry of the surfaces of the two optical elements can be set in a reversible dynamic manner, as a result of which further correction degrees of freedom emerge.

One of the optical elements can be set in such a way that it assumes the form of a plane-parallel plate.

In particular, it is also feasible to use two optical elements, which both have a plane-parallel basic form and into which the desired phase effects can be impressed locally. Here, the plane-parallel plates can be arranged with a distance of less than 25 mm, in particular of less than 10 mm, from one another.

The manipulator can be arranged at a distance of less than 100 mm, preferably at a distance of less than 50 mm, from a mask to be imaged. Thanks to the proximity of the field, a spatially resolved phase effect of the element translates into a variation of the wavefront over the image location. Using this, it is preferably possible to compensate scale aberrations and heating effects via quick spatial variation on the mask. Unevenness with high spatial frequencies on the semiconductor substrate to be exposed can preferably be compensated for at this location. Particularly preferably at this point, only long-wave wavefront aberrations are corrected at the respective image point, such as e.g. wavefront tilt, deviating wavefront curvature (defocus) and astigmatism, in each case of the lowest order.

Furthermore, the manipulator can lie in a near-pupil position. A spatially resolved manipulation of the wavefront will have a relatively field-constant effect, with at most slow field variation. Therefor, higher wave wavefront aberrations are tangible, both in the radial and azimuth order. These aberrations include coma, spherical aberration and higher order astigmatism, as well as three-wave, four-wave and higher-wave wavefront deformations.

Here, the so-called paraxial subaperture ratio can be used as measure for the position of the manipulator in the system.

The paraxial subaperture ratio is given by $$\frac{r}{|h|+|r|}\mathrm{sgn}h,$$

where r is the paraxial marginal ray height, h is the paraxial chief ray height and the sign function sign x denotes the sign of x, where sgn0=1 by convention. A definition of the paraxial marginal ray or the paraxial chief ray is given in "Fundamental Optical Design" by Michael J. Kidger, SPIE PRESS, Bellingham, Wash., USA, which is hereby incorporated by reference.

The paraxial subaperture ratio is a signed variable, which is a measure for the near-field or near-pupil position of a plane in the beam path. By definition, the subaperture ratio is normalized to values between −1 and 1, wherein the 0 of the paraxial subaperture ratio corresponds to each field plane and wherein each pupil plane corresponds to a point of discontinuity with a jump in the paraxial subaperture ratio from −1 to +1 or from +1 to −1. Accordingly, paraxial subaperture ratios of 0 denote field planes for the present application, while an absolute value of the paraxial subaperture ratio of 1 determines a pupil plane. Near-field planes therefore have paraxial subaperture ratios which lie close to 0, while near-pupil planes have paraxial subaperture ratios, which, in terms of absolute value, lie close to 1. The sign of the paraxial subaperture ratio denotes the position of the plane in front of or behind a reference plane. For the definition, use can be made, for example, of the sign of the intersection point of a coma ray in the relevant plane.

Two planes in the beam path are said to be conjugate if they have similar, in particular the same, paraxial subaperture ratios. In this case, similar means that the relative difference of the paraxial subaperture ratios is less than 20%, preferably less than 5%, more preferably less than 1%. Pupil planes are conjugate to one another, as are field planes.

Here, the manipulator can be arranged at a point in the system at which the paraxial subaperture ratio, in terms of absolute value, is greater than 0.8, preferably greater than 0.9. Such positioning should be considered to be near-pupil within the meaning of the present description.

The two optical elements advantageously can be positioned during a scanning procedure of the projection exposure apparatus.

In other words, while taking into account the topology of the semiconductor substrate to be exposed in the subsequent scanning procedure, it is possible to set at least one of the surfaces of the optical elements in such a way that, during synchronous movement of the optical elements with the scanning procedure, the ideal correction effect required at the respective scanning time is impressed into the wavefront of the employed radiation. Since there may be the option of rotating or displacing the optical elements against one another or with one another, it is possible to realize further correction degrees of freedom. In principle, a multiplicity of possible movements of the optical elements involved is feasible, such as e.g. a common displacement in the light direction or at a certain angle in relation to the light direction, in particular perpendicular thereto. In so doing, plane-parallel plates can be used in a particularly advantageous manner as optical elements.

At least one of the optical elements in particular can be actuated in a default state in such a way that the resulting local phase change of a light wave passing through the at least two optical elements is less than 20%, in particular less than 10%, of the phase change occurring when the light wave passes through one of the two optical elements.

Thus, in this case, the phase effects of the two optical elements involved largely compensate one another in an initial state of the two optical elements. However, if one of the two optical elements is deflected from the zero position realized thus, a significant phase effect of the manipulator can be achieved very quickly. The phase change achievable by a change in position of the two optical elements in relation to one another in this case depends, inter alia, on the spatial gradient of the phase effect of the individual optical element. Here, the phase effect can depend linearly on the offset of the two optical elements, but this is not mandatory.

In the following text, the invention will be explained in more detail on the basis of the drawing.

In detail:

FIG. 1 shows a schematic illustration of a projection exposure apparatus according to the invention;

FIG. 2 likewise schematically shows a detailed illustration of the employed optical elements;

Figure 1:
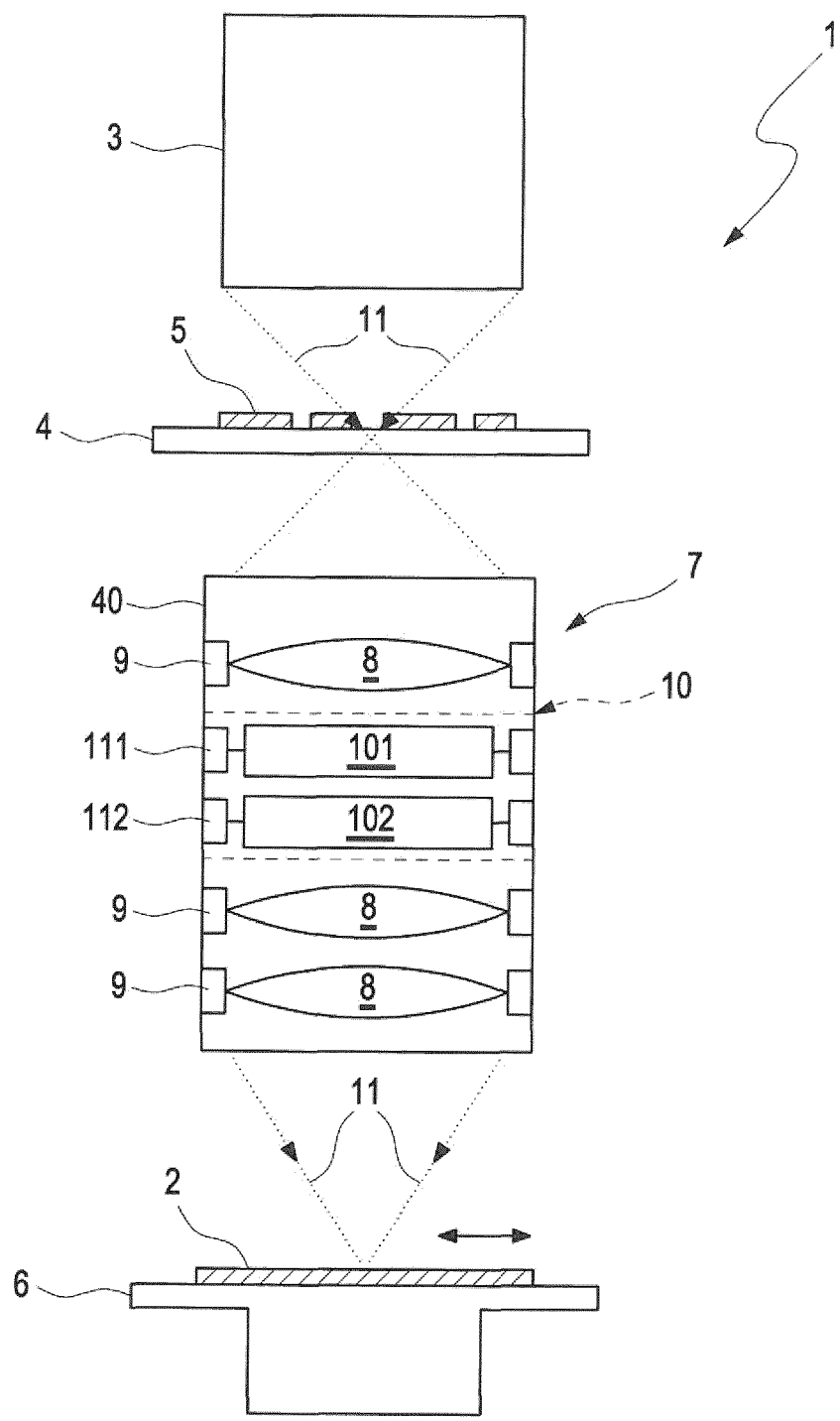
FIG. 1 depicts a projection exposure apparatus 1 according to the invention. The projection exposure apparatus serves to expose structures on a substrate coated with photosensitive materials, which substrate generally consists mainly of silicon and is referred to as a wafer 2, for the purposes of producing semiconductor elements, such as e.g. computer chips.

Here, the projection exposure apparatus 1 substantially consists of an illumination device 3, a device 4 for holding and exactly positioning a mask provided with the structure, a so-called reticle 5, by which the subsequent structures on the wafer 2 are determined, a device 6 for holding, moving and exactly positioning precisely this wafer 2 and an imaging device, namely a projection lens 7, with a plurality of optical elements 8, which is held in a lens housing 40 of the projection lens 7 by mounts 9.

Here, the basic operating principle provides for the structures introduced into the reticle 5 to be imaged on the wafer 2; the imaging is generally carried out in a reducing manner.

The illumination device 3 provides a projection beam 11 in the form of electromagnetic radiation, which is required for imaging the reticle 5 on the wafer 2. A laser, a plasma source or the like can be used as a source for this radiation. In the illumination device 3, the radiation is formed via optical elements in such a way that the projection beam 11 has the desired properties in respect of diameter, polarization, form of the wavefront and the like when incident on the reticle 5.

An image of the reticle 5 is produced by the rays 11 and transferred onto the wafer 2 by the projection lens 7 in a correspondingly reduced manner, as was already explained above. Here, the reticle 5 and the wafer 2 can be displaced in a synchronous manner such that during a so-called scanning procedure regions of the reticle 5 are imaged practically continuously on corresponding regions of the wafer 2. The projection lens 7 has a multiplicity of individual refractive, diffractive and/or reflective optical elements 8, such as e.g. lens elements, mirrors, prisms, end plates and the like.

In FIG. 1, the manipulator 10 is easy to identify: in the shown example, it has as optical elements two plane-parallel plates 101 and 102, which can be moved against one another via the actuators 111 and 112. Here, it is not mandatory for the manipulator 10 to be arranged at the position in the projection lens 7 shown in FIG. 1; a near-field or near-pupil position of the manipulator 10 or else the use of the manipulator 10 in the illumination system 3 is also feasible. The use of a plurality of manipulators in a projection exposure apparatus 1 is likewise feasible.

Figure 2:
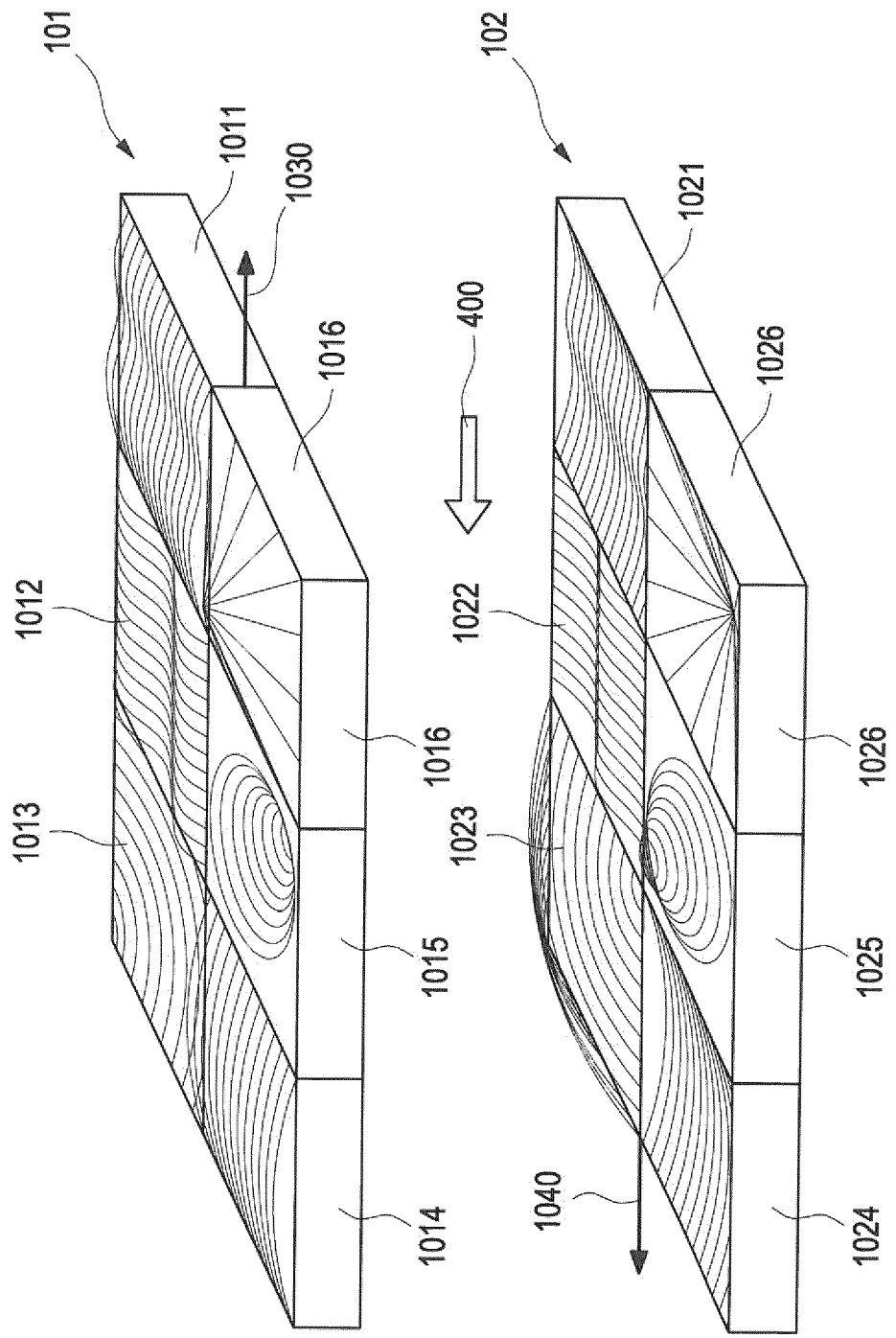

FIG. 2 shows a detailed illustration of the two plane-parallel plates 101 and 102 of the manipulator 10, with a temperature distribution indicated by appropriate shading. Here, the two plane-parallel plates are subdivided into temperature regions 1011-1016 and 1021-1026, respectively, which, for example, can be produced by virtue of the heating zones of an optical element known from WO2009/026970A1 being actuated accordingly. It is possible to identify from FIG. 2 that the temperature distributions of successive temperature regions in the beam direction, such as e.g. 1011 and 1021 or 1014 and 1024, are configured to complement one another. As a result of this, the phase effects of the mutually corresponding temperature regions would largely offset one another and the overall effect of the manipulator would be practically zero. However, if, as indicated by arrows 1030 and 1040, a lateral offset of the two optical elements 101 and 102 in relation to one another were to be set, there would immediately be a spatially resolved phase change in the electromagnetic radiation passing through the corresponding manipulator. Since this offset can occur comparatively quickly, a desired correction effect of the manipulator can also be achieved quickly. In particular, a multiplicity of different correction effects can be achieved on very short timescales purely by the direction and the deflection or by the type of the relative movement (translation, tilt, rotation or combinations). Here, being able to set the temperature distribution even on a timescale from approximately 10 seconds to approximately 10 minutes renders it possible to achieve additional desired phase effects within an acceptable amount of time. Indicated schematically by the arrow 400 is a fluid flow, which further improves the ability for thermal control or regulation of the arrangement according to the invention.

Figure 3:
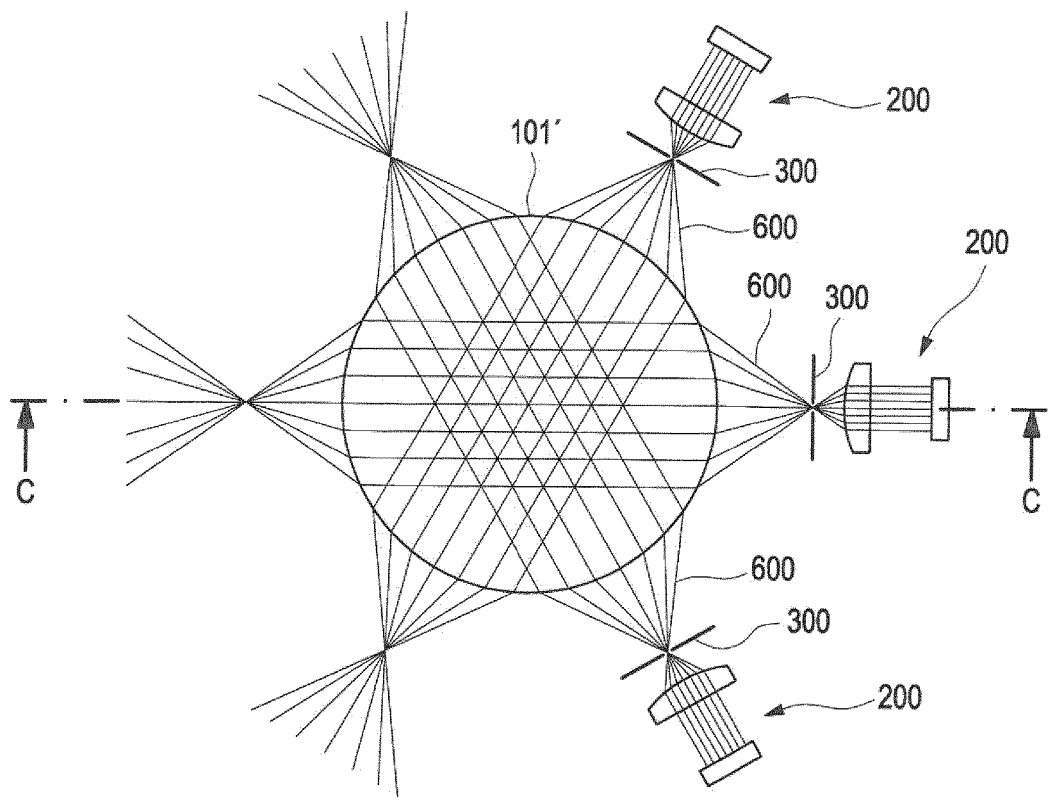
FIG. 3 shows a variant for a further embodiment of the invention.

FIG. 3 shows a variant of the invention, in which a locally resolved selectable temperature profile can be brought about by the manipulator without interfering with the propagation of the used light. Here, the mentioned figure shows, in a top view, an optical element 101', which can be configured in particular as a plane-parallel plate. Arranged on the peripheries of the optical element 101' are light sources 200, which, in the shown example, transmit light rays 600 through the side face of the optical element 101' and through the latter by virtue of a stop 300. In other words, in the shown example, the directed optical radiation impinges on the optical element 101' from the side. In particular, the optical radiation can be infrared radiation in the region of approximately 1450 nm or else in the region of approximately 2200 nm. By way of example, this infrared radiation can be emitted by LEDs or laser diodes. In particular, the alignment of the beam formed by the rays 600 can be achieved by virtue of the stop 300 having a multiplicity of adaptable openings, which generate a desired light distribution in the optical element 101' by appropriate opening, closing or else directing. In particular, the desired light distribution also can be achieved by an array of LEDs or laser diodes, a micromirror array or else a correspondingly arranged fiber bundle. Overall, the effect that can be achieved by the directed radiation through the optical element 101' is that a light intensity profile that can be set emerges in the optical element as a result of the interaction between the light sources 200. As a result of the absorption in the optical element 101' of the light emitted by the light sources 200, this leads, overall, to a temperature profile that can be set, similar to as described in FIG. 2. However, in contrast to the case shown in FIG. 2, it is not necessary to introduce e.g. heating wires or the like into the path of the optical used radiation of the superordinate projection exposure apparatus, and so the imaging quality of the associate projection exposure apparatus is not deteriorated by the occurrence of e.g. stray light on opaque conductor tracks—even if these are very narrow.

In place of the examples mentioned above, use alternatively also can be made of an appropriately configured refractive optical system, i.e. in particular making use of lens elements, micro-lenses or micro-lens arrays.

Figure 4:
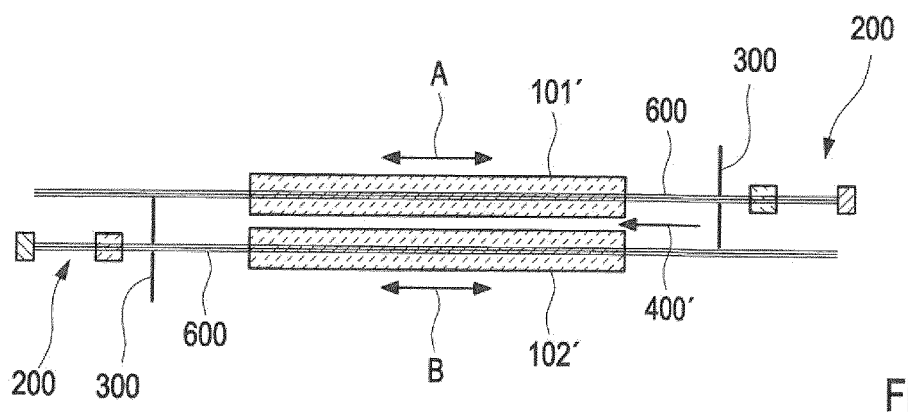
FIG. 4 shows an embodiment of the invention using the variant shown in FIG. 3.

FIG. 4 shows a sectional illustration of the optical element 101', known from FIG. 3, along the section C-C, wherein the further optical element 102' with further light sources 200 and stops 300 is additionally arranged below the optical element 101'. It is easy to identify that, in the arrangement shown in FIG. 4, the fluid flow 400' for cooling and therefore, overall, for setting a temperature profile that can be regulated, is guided through the interspace between the two optical elements 101' and 102'. The relative mobility of the two optical elements 101' and 102' in relation to one another, indicated via the arrows A and B, is likewise easy to identify in FIG. 4; here, a piezoelectric actuator system, optionally in conjunction with an appropriate drive, can be used for the required deflection of the optical elements 101' and 102' in relation to one another, which deflection usually lies in the range between 200 µm and 1 mm.

Figure 5:
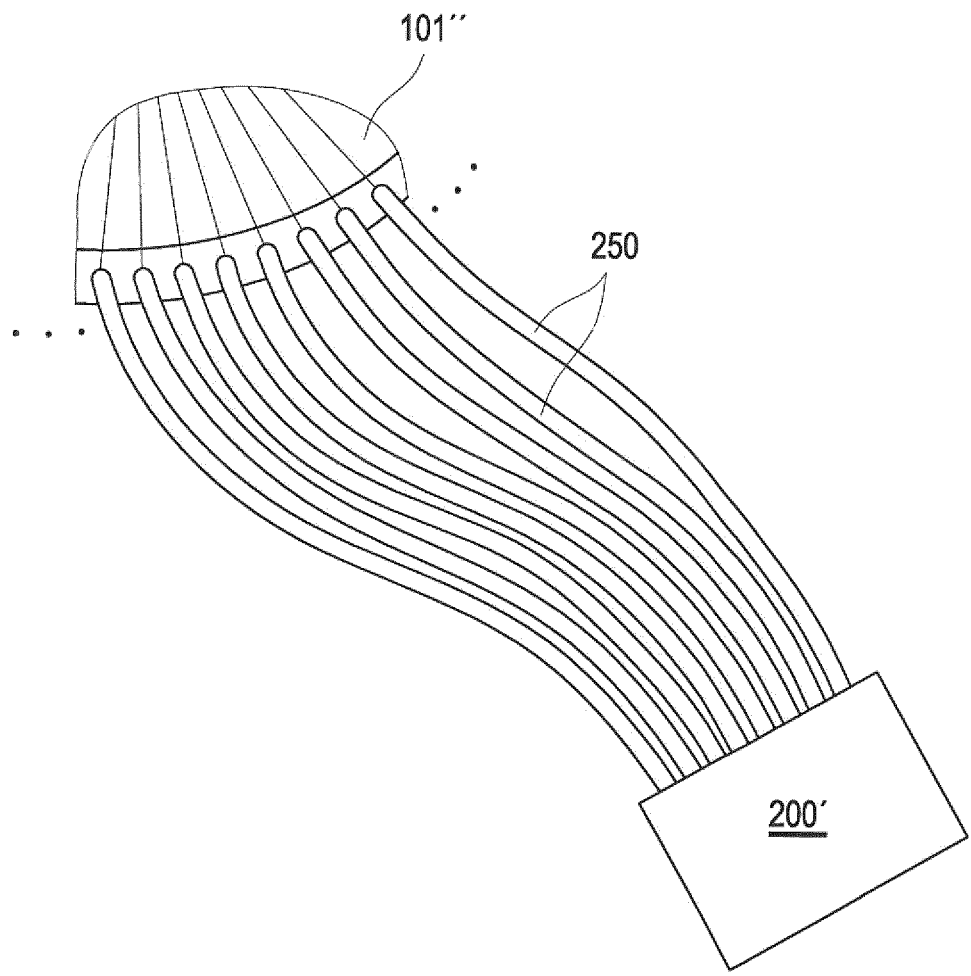
FIG. 5 shows an alternative embodiment to FIGS. 3 and 4.

FIG. 5 shows an alternative embodiment of the light source 200. In this case, the light source 200' is connected to optical waveguides 250, in particular optical fibers, which lead radiation, used for the temperature control of the optical element 101", to the edge region of the optical element 101" depicted in sections. In this manner, it is also possible to use a single central light source, which optionally is also at a distance from the rest of the system. The desired light distribution is then achieved merely by a suitable selection of the intensity of the coupling into the corresponding fiber optical waveguides 250. In this arrangement, it is advantageous that, as result of the spatial distance between the light source 200' and the optical part of the device, the cooling of the light source 200' itself is considered to be less critical since heat possibly emanating from it does not have a negative effect on the imaging properties of the superordinate system.

In principle, for setting the beam profile in the optical element 101' or 102', there are the options already disclosed in the international patent application WO 2013/044936 A1 (Zellner et al), respectively TW 201329645 A1, wherein the content of the disclosure of the aforementioned documents is intended to be incorporated completely in the present application by reference.

The invention claimed is:

1. A method of using a semiconductor lithography projection exposure apparatus comprising first and second optical elements, at least one of the first and second optical elements being spatially dependent in terms of its effect on an optical wavefront passing therethrough so that a local phase change of a wavefront propagating in the apparatus is produced when there is movement of the first and second optical elements relative to each other, the spatially dependent effect being settable in a reversibly dynamic manner, the method comprising:

setting the effect on the wavefront via a temperature profile that is selected in a locally resolved manner in the at least one member selected from the group consisting of the first and second optical elements; and actuating at least one of the first and second optical elements in a default state in so that a resulting local phase change of a light wave passing through the first and second optical elements is less than 20% of the phase change occurring when the light wave passes through one of the first and second optical elements, wherein actuating the at least one of the first and second optical elements comprises reversibly changing at least one parameter selected from the group consisting of: i) a locally resolved shape of a surface of the first optical element; ii) a locally resolved shape of a surface of the second optical element; iii) a locally resolved refractive index of the first optical element; and iv) a locally resolved refractive index of the second optical element and wherein:

the semiconductor lithography projection exposure apparatus further comprises at least one member selected from the group consisting of a Lorentz actuator, a pressure bellows and a piezoelectric element; and the method further comprises using the at least one member to cause movement of the first and second optical elements relative to each other.

2. The method of claim 1, wherein at least one of the first and second elements comprises an aspherical surface with a settable geometry.

3. The method of claim 1, further comprising positing the first and second optical elements during a scanning procedure of the semiconductor lithography projection exposure apparatus.

4. The method of claim 1, further comprising using resistance heating to set the temperature profile.

5. The method of claim 4, further comprising flowing a fluid past at least one of the first and second optical elements to set the temperature profile.

6. The method of claim 1, wherein at least one of the first and second optical elements is settable in a reversibly dynamic spatially dependent manner and is also movable relative to a default state position.

7. An apparatus, comprising:

a manipulator configured to reduce image aberrations during use of the apparatus, the manipulator comprising first and second optical elements, wherein:

the first and second optical elements are positionable relative to each other;

for at least one of the first and second optical elements, an effect of the optical element on an optical wavefront passing therethrough is spatially dependent so that a local phase change of a wavefront propagating in the apparatus is produced;

the spatially dependent effect is settable in a reversibly dynamic manner via a temperature profile that is selectable in a locally resolved manner;

the spatially dependent effect is settable via a temperature profile of at least one member that is selectable in a locally resolved manner;

the at least one member is selected from the group consisting of the first optical element, the second optical element and a combination thereof; and the apparatus is a semiconductor lithography projection exposure apparatus.

8. The apparatus of claim 7, wherein, for at least one of the first and second optical elements, the optical element is actuatable in a default state so that a resulting local phase change of a light wave passing through the first and second optical elements is less than 20% of the phase change occurring when the light wave passes through one of the first and second optical elements.

9. An apparatus, comprising:

a manipulator configured to reduce image aberrations during use of the apparatus, the manipulator comprising first and second optical elements; and at least one member selected from the group consisting of a Lorentz actuator, a pressure bellows and a piezoelectric element, wherein:

the first and second optical elements are positionable relative to each other;

for at least one of the first and second optical elements, an effect of the optical element on an optical wavefront passing therethrough is spatially dependent so that a local phase change of a wavefront propagating in the apparatus is produced;

the spatially dependent effect is settable in a reversibly dynamic manner by reversibly changing at least one parameter selected from the group consisting of a locally resolved refractive index of the first optical element and a locally resolved refractive index of the second optical element;

for at least one of the first and second optical elements, the optical element is actuatable in a default state so that a resulting local phase change of a light wave passing through the first and second optical elements is less than 20% of the phase change occurring when the light wave passes through one of the first and second optical elements;

the at least one member is configured to cause movement of the first and second optical elements relative to each other; and the apparatus is a semiconductor lithography projection exposure apparatus.

10. The apparatus of claim 9, wherein:

the spatially dependent effect is settable via a temperature profile of at least one member that is selectable in a locally resolved manner; and the at least one member is selected from the group consisting of the first optical element, the second optical element and a combination thereof.

11. The apparatus of claim 10, wherein at least one of the first and second elements comprises an aspherical surface with a settable geometry.

12. The apparatus of claim 10, further comprising a resistance heating mechanism configured to set the temperature profile.

13. The apparatus of claim 10, further comprising a device configured to produce a fluid flow past at least one of the first and second optical elements to set the temperature profile.

14. The apparatus of claim 10, wherein a geometry of the surfaces of first and second optical elements is settable in a reversibly dynamic manner.

15. The apparatus of claim 10, wherein at least one of the first and second optical elements is settable so that it is a plane-parallel plate.

16. The apparatus of claim 10, wherein the manipulator is less than 100 millimeters from an object field of the apparatus.

17. The apparatus of claim 10, wherein the manipulator is in a near-pupil position.

18. The apparatus of claim 10, wherein at least one of the first and second optical elements is settable in a reversibly dynamic spatially dependent manner and is also movable relative to a default state position.

19. The apparatus of claim 10, further comprising an illumination system and a projection lens, wherein the manipulator is in the projection lens.

20. The apparatus of claim 10, wherein the at least one parameter is selected from the group consisting of: i) a locally resolved shape of a surface of the first optical element; and ii) a locally resolved shape of a surface of the second optical element.

21. The apparatus of claim 10, wherein the at least one parameter is selected from the group consisting of: i) a locally resolved shape of a surface of the first optical element; and ii) a locally resolved shape of a surface of the second optical element.

* * * * *